US006956390B1

(12) United States Patent
Feltner et al.

(10) Patent No.: US 6,956,390 B1
(45) Date of Patent: Oct. 18, 2005

(54) METHOD AND APPARATUS FOR VERIFYING TEMPERATURE DURING INTEGRATED CIRCUIT THERMAL TESTING

(75) Inventors: Thomas A. Feltner, Tracy, CA (US); James S. Aylett, Burlingame, CA (US); John C. Marley, San Jose, CA (US); Thomas A. Gallagher, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/651,779

(22) Filed: Aug. 29, 2003

(51) Int. Cl.[7] .................. G01R 31/02; G01R 31/26
(52) U.S. Cl. ............................. 324/760; 324/765
(58) Field of Search .................. 324/537, 754–755, 324/760–761, 765; 439/61, 66, 68, 71; 257/719; 269/21, 97

(56) References Cited

U.S. PATENT DOCUMENTS

| | | | | | |
|---|---|---|---|---|---|
| 5,159,266 | A | * | 10/1992 | Appold | 324/537 |
| 5,160,883 | A | * | 11/1992 | Blanz | 324/760 |
| 5,436,570 | A | * | 7/1995 | Tan | 324/761 |
| 5,475,316 | A | * | 12/1995 | Hurley et al. | 324/750 |
| 5,481,203 | A | * | 1/1996 | Appold | 324/755 |
| 5,519,331 | A | * | 5/1996 | Cowart et al. | 324/755 |
| 5,635,832 | A | * | 6/1997 | Ito et al. | 324/158.1 |
| 5,977,785 | A | * | 11/1999 | Burward-Hoy | 324/760 |
| 6,420,885 | B1 | * | 7/2002 | Fredrickson | 324/754 |
| 6,457,251 | B1 | * | 10/2002 | Feltner et al. | 73/1.79 |
| 6,489,793 | B2 | * | 12/2002 | Jones et al. | 324/760 |
| 6,541,991 | B1 | * | 4/2003 | Hornchek et al. | 324/755 |
| 6,552,528 | B2 | * | 4/2003 | Frame | 342/755 |
| 6,572,388 | B2 | * | 6/2003 | Lee | 439/71 |
| 6,681,352 | B1 | * | 1/2004 | Fredrickson | 324/158.1 |
| 6,703,852 | B1 | * | 3/2004 | Feltner | 324/754 |

* cited by examiner

Primary Examiner—Jermele Hollington
(74) Attorney, Agent, or Firm—E. Eric Hoffman; John King

(57) ABSTRACT

An test block includes a box-like body and four rails extending from side edges of the body. During thermal testing, the test block is mounted between a test head and a test socket such that the rails provide a thermal path between the test block body and contact pads formed on the test socket. In this manner the rails emulate the thermal path formed by the metal leads extending from a conventional Quad Flat Pack Integrated Circuit (QFP IC), thereby reliably duplicating the actual thermal path of the QFP IC. The test block is mounted on the test system and its temperature is measured before and after testing QFP IC devices. Confirming that the test block is within test temperature specifications before and after the QFP-IC test procedure provides a highly reliable verification that the QFP-IC's actual test temperature is within the test temperature specifications.

12 Claims, 4 Drawing Sheets

METHOD AND APPARATUS FOR VERIFYING TEMPERATURE DURING INTEGRATED CIRCUIT THERMAL TESTING

FIELD OF THE INVENTION

The present invention relates to automated test equipment for testing integrated circuits (ICs), and more particularly to apparatus and methods for verifying the temperature of Quad Flat Pack-type (QFP-type) IC devices during thermal testing.

RELATED ART

Packaged integrated circuits (ICs) are often tested at a selected high or low temperature (e.g., 100° C.) to verify that the ICs function properly at the selected temperature. This thermal testing process is typically carried out using automatic test equipment (ATE) system that includes an IC test signal generator (IC tester), a test fixture (e.g., a socket) for transmitting electrical signals from the IC test signal generator to an IC device-under-test (DUT), and a handler system that is positioned inside of an insulated chamber and moves the DUTs between a shipping tray and the test fixture. Thermal testing typically involves verifying that the IC DUTs were tested at least at the specified temperature (or within an acceptable variance thereof).

FIG. 1 is a block diagram showing a handler system 100 used to move packaged IC DUTs between shipping trays 50 and an IC tester 70. Handler system 100 is consistent with pick-and-place handler systems produced by, for example, Seiko Epson Corp. and sold under model number HM3000 (Hummingbird). Note that handler system 100 is typically located inside of an insulated chamber (not shown) that is designed to maintain an elevated or reduced temperature environment that is determined by the selected thermal test process.

Handler system 100 includes an input arm 110 that moves DUTs between shipping tray 50, a soaking tray 150 and a shuttle 120, and a test arm 130 that moves DUTs between shuttle 120 and a test fixture 140. Soaking tray 150 is provided between shipping tray 50 and shuttle 120 to facilitate pre-heating or pre-cooling of the DUTS before testing.

Input arm 110 is driven by a positioning mechanism (not shown) to move horizontally over shipping tray 50, soaking tray 150, and shuttle 120, and includes one or more vertically movable frames (referred to as "hands") 115, each hand 115 supports one device pick-up head 160. Each device pick-up head 160 includes a base structure 170 held by an associated hand 115, a heater (HTR) block 175 for maintaining the head at the specified temperature, and a movable portion 180 that transmits a vacuum pressure used to secure and pick-up DUTS during movement from one location to another. Specifically, to move DUTS between shipping tray 50 and soaking tray 150, input arm 110 is moved horizontally over shipping tray 50, and then hands 115 are lowered until movable portions 180 of each device pick-up head 160 contact the upper surface of the DUTS stored on shipping tray 50. Next, vacuum pressure is transmitted to device pick-up heads 160 to secure the DUTS, and the hands are moved upward from shipping tray 50, thereby lifting the DUTS. Input arm 110 is then moved horizontally over soaking tray 150, and hands 115 are lowered until the DUTS contact soaking tray 150. The vacuum pressure is then released, and a brief positive pressure (puff) is transmitted to each device pick-up head 160, thereby separating the DUTS from device pick-up heads 160, which are then moved upward from soaking tray 150. After a suitable period of time for allowing the DUTs to reach the specified temperature, the DUTs are moved from soaking tray 150 to shuttle 120, and from shuttle 120 back to shipping tray 50 after testing is completed using a sequence similar to that described above.

Shuttle 120 is driven by a horizontal positioning mechanism (not shown) to move between a first position accessible by input arm 110, and a second position accessible by test arm 130. As depicted in FIG. 1, shuttle 120 moves between a staging/soaking (upper) area from which the DUTS are loaded and unloaded by input arm 110, and a test (lower) area where the DUTS are loaded and unloaded by test arm 130.

Similar to input arm 110, test arm 130 is driven by a positioning mechanism (not shown) to move horizontally between shuttle 120 (when located in the test (lower) area) and test fixture 140. Test arm 130 includes one or more vertical movable hands 135, each supporting a device pick-up head 160 that includes a base structure 170, a heater block 175, and a movable portion 180. Test arm 130 uses a sequence of movements similar to that described above for input arm 110 to move DUTS between shuttle 120 and test fixture 140. After tests are performed using test signals transmitted from IC tester 70, the DUTS are picked up by device pick-up heads 160, and returned to shuttle 120, which then returns the tested DUTS to the staging/soaking (upper) area (see FIG. 1) for replacement onto shipping tray 50.

As mentioned above, thermal testing typically involves verifying that the DUTs were maintained at the specified test temperature during the testing process (i.e., while receiving and processing test signals transmitted from IC tester 70). Some IC devices include an on-chip temperature diode that communicates with IC tester 70 through test fixture 140, and indicates the actual DUT temperature during the testing process. However, other (typically less-expensive) IC devices do not include this temperature diode, and require the use of other temperature verification procedures. One such conventional procedure employs heater blocks 175 of test heads 160 to verify the DUT temperature during thermal testing. In particular, each heater block 175 includes a temperature sensor and heating/cooling element (not shown) that cooperate with a temperature control unit to maintain test head 160 at the specified temperature. For example, when the sensor indicates that the temperature of test head 160 is below the specified temperature, the heater element of heater block 175 is activated to elevate the temperature of test head 160 until the specified temperature is achieved. Because the DUTs are attached to the test heads 160 in the manner described above, this arrangement assumes that the DUTs are maintained at the temperature detected by the heater blocks of the test heads (i.e., that the DUTs are at the specified temperature if the test head is at the specified temperature).

A problem with the conventional verification procedure described above is that several factors can cause the actual temperature of the DUTs to deviate significantly from the temperature measured by the heater block and/or from the specified test temperature. For example, any increased resistance in the cable connected to the heat sensor of the heater block (e.g., due to motion, age, or oxidation) can cause the ATE system to erroneously determine that the DUT is hotter than it really is, and the heater block will compensate by turning off the heater unit/and or driving down the temperature of the heater block, thereby potentially causing the DUT to fall out of the specified temperature range. In another example, as mentioned above, the heater block of the test head is separated from the DUTs by portions 180, so the temperature measured at the test head may deviate from the actual temperature of the DUTs (particularly in the case where the fixture includes materials exhibiting relatively poor thermal conduction). Other mechanisms can also contribute to a significant temperature difference between the DUT and associated heater block temperature.

One approach to addressing the problem described above is to employ a test block including a thermocouple that is placed between the test head and test socket, and measuring the temperature of the test block to verify that the ATE system is within the specified test temperature range. However, conventional test blocks typically comprise box-shaped blocks of metal that are mounted between the test head and test socket of the ATE system. Such test blocks typically do not accurately emulate the actual thermal path from the test head to the test socket, thereby causing the test block to achieve a temperature that differs from the subsequently tested IC devices. This temperature is a particular problem when the IC to be tested is a Quad Flat Pack-type (QFP-type) IC device due to the significant thermal path produced by the leads of the QFP-type IC device and contact pads formed on the test socket.

What is needed is a method and apparatus for verifying that QFP-type IC devices are within a specified temperature range throughout thermal testing without using on-chip temperature measuring electrodes.

SUMMARY

The present invention is directed to a method for verifying the temperature of a QFP-type IC device during thermal testing that overcomes the problems associated with conventional thermal testing methods by utilizing a special test block that is designed to emulate the thermal path between the test head and test socket of an automatic test equipment (ATE) system, thereby providing a more accurate estimation of the actual test temperature encountered by subsequently tested QFP-type IC devices.

According to an aspect of the present invention, the test method utilizes a test block formed from a material having a relatively high thermal conductivity (e.g., Aluminum), and includes a box-shaped body and one or more angled rails extending downward from one or more side edges of the body. When mounted between the test head and the test socket in an ATE system, a bottom end of the angled rails is pressed against the contact pads of the test socket, thereby providing a thermal path between the test block and the contact pads of the test socket that emulates the thermal characteristics of leads extending from the actual QFP-type IC device. Accordingly, the test block and associated method of the aspect of the present invention provide a substantially more accurate prediction of IC test temperatures than conventional methods using box-like test blocks that do not include lead-emulating structures.

According to another aspect of the present invention, the test block includes a thermocouple that is inserted into a hole formed in a side of the test block such that a tip of the thermocouple is located at a central location in the box-like body. In one embodiment, the hole for the thermocouple passes through an angled rail located on one side of the test block to a second angled rail located on an opposite side of the test block, thereby taking advantage of small gap provided between the test head and test socket when the test block is mounted therebetween. In one embodiment, the hole extends completely through the test block.

According to another aspect of the present invention, a method for verifying a temperature of a QFP-type IC device during a thermal testing process begins by mounting the test block between the test head and test socket of an ATE system such that a thermal path is established from the test head to the contact pads of the test socket through the angled rails. After the test block reaches a stable temperature, a first temperature of the test block is measured and compared with a stored temperature range (i.e., the specified test temperature plus/minus an acceptable variance). If the measured temperature is within the specified temperature range, one or more DUTs are systematically tested by ATE system using conventional methods. After testing the DUTS, the test block is re-mounted between the test head and test socket, and a second temperature is measured. If the second temperature is within the specified temperature range, then successful testing of the previously-tested DUTs is verified. That is, the another aspect of the present invention relies on the reasonable assumption that if the first temperature of the test block is within specification before testing the DUTs, and the second temperature of the test block is within specification after testing the DUTs, then the temperature of the DUTs was within the specified range throughout the actual testing process.

The present invention will be more fully understood in view of the following description and drawings.

DETAILED DESCRIPTION

An exemplary embodiment of the present invention is described below as being utilized to verify the thermal testing temperature of QFP-type IC that do not include on-chip temperature measuring diodes. Those of ordinary skill in the art will recognize that the methods and structures associated with the present invention may be extended to IC package types other than QFP-type devices, and may be utilized to verify temperatures read from ICs having on-chip temperature measuring diodes. Therefore, the present invention is limited only by the appended claims.

Figure 2A:
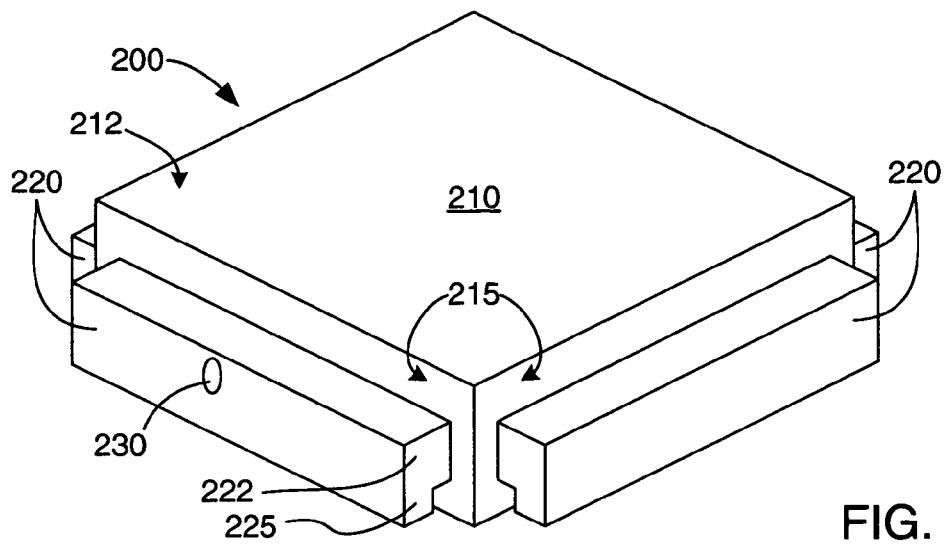
FIGS. 2(A), 2(B) and 2(C) are perspective, top and cross-sectional side views, respectively, showing a test block according to an embodiment of the present invention.
Figure 2B:
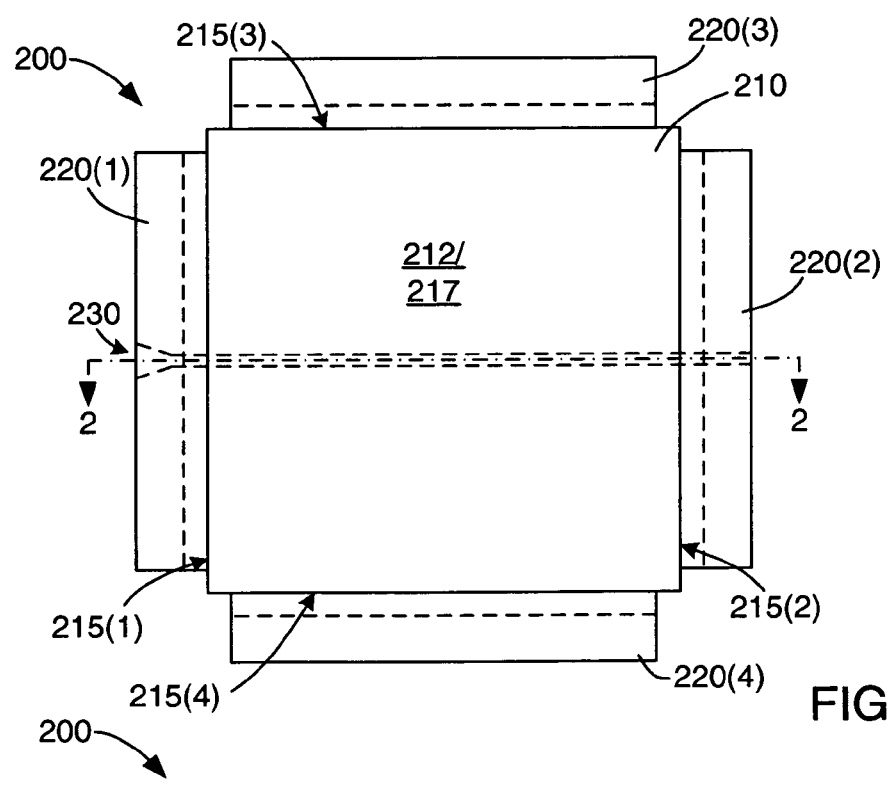
Figure 2C:
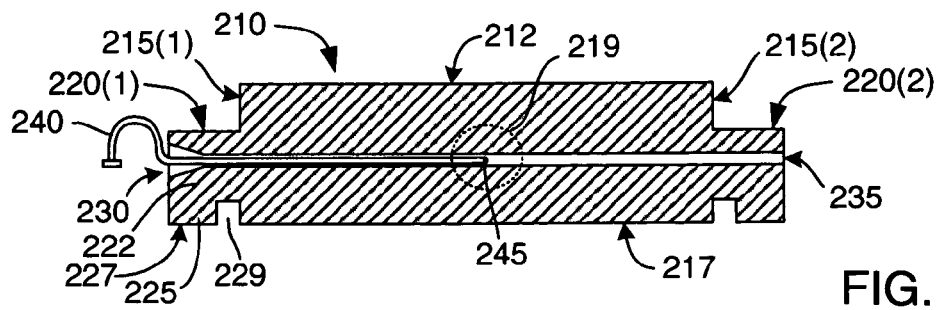

FIGS. 2(A), 2(B), and 2(C) show an exemplary test block 200 that is utilized in the manner described below to verity the temperature of a QFP-type IC device during thermal testing. As described in additional detail below, test block 200 is utilized to measure the temperature between a test head and a test socket in an ATE system. This temperature is then used to verify that QFP-type IC devices subsequently (or previously) tested by the ATE system are within a specified test temperature range. In particular, test block 200 are formed from one or more metals (e.g., Aluminum or Copper) or another material that closely models the thermal conductivity characteristics of an actual IC device. Test block 200 is then subjected to the same thermal conditions (e.g., heating on a soaking plate and mounting between a test head and test socket in the ATE system) as that applied to the actual devices. Accordingly, the present invention provides a method whereby a temperature measured from test block 200 can be reliably used to verify the temperature an actual IC device tested immediately before or after the temperature measurement is taken.

Referring to FIGS. 2(A), 2(B), and 2(C), test block 200 includes a box-shaped body 210 having an upper surface 212, a lower surface 217, and side walls 215 extending between upper surface 212 and the lower surface 217. As indicated in FIG. 2(B), in one embodiment upper surface 212 and lower surface 217 are substantially square, and block 200 defines four side walls 215(1) through 215(4). In other embodiments, body 210 may have a rectangular or any shape that resembles an IC to be tested, provided the upper surface and lower surface are shaped such that they are appropriately received by a corresponding test head and test socket, respectively. Note that FIG. 2(C) is a cross-sectional side view taken along section line 2—2 of FIG. 2(B).

The thermal characteristics of conventional QFP-type IC devices will now be discussed in detail in order to better understand the benefits of embodiments of the present invention.

Figure 1:
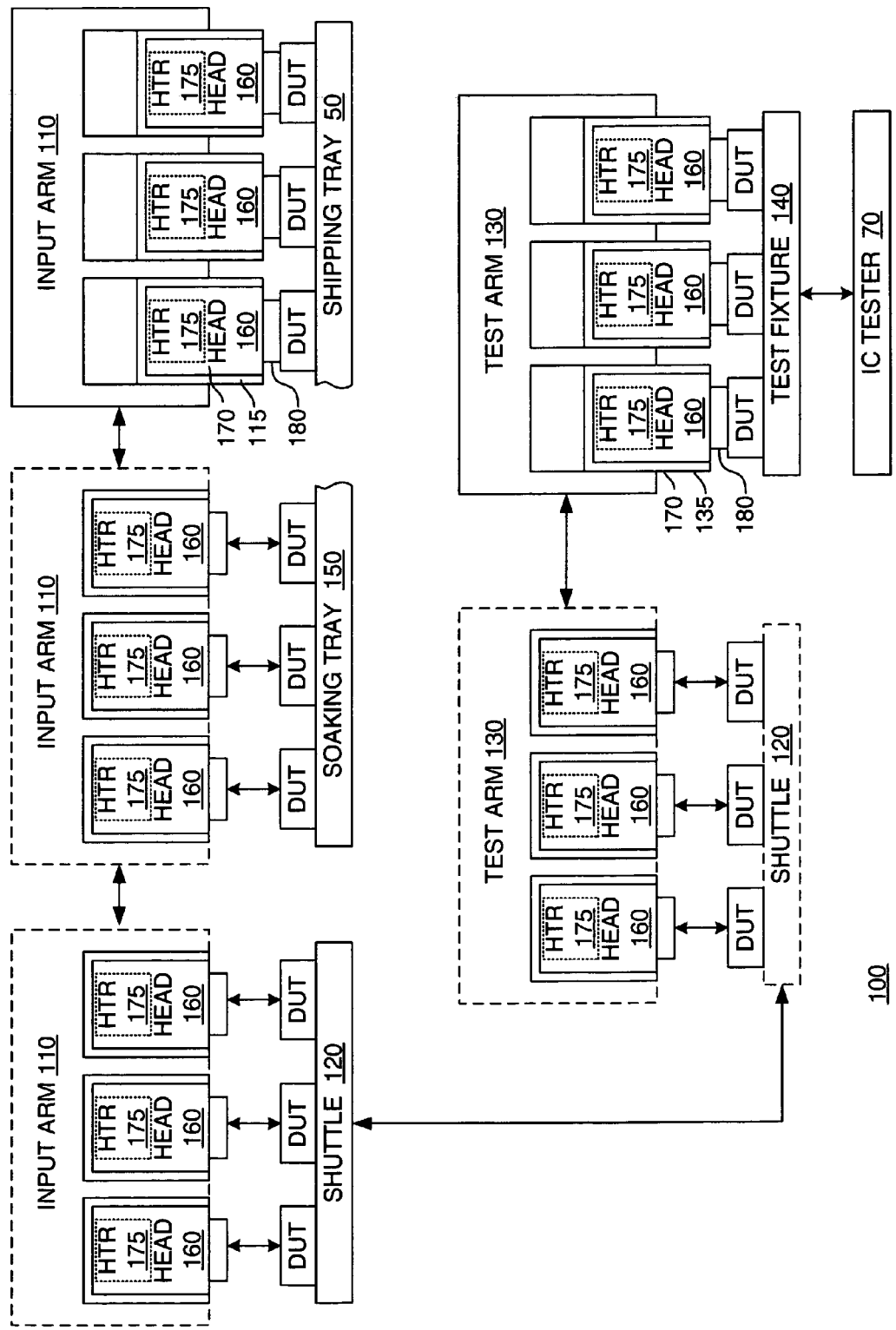
FIG. 1 is a diagram depicting a simplified conventional ATE arrangement.
Figure 3:
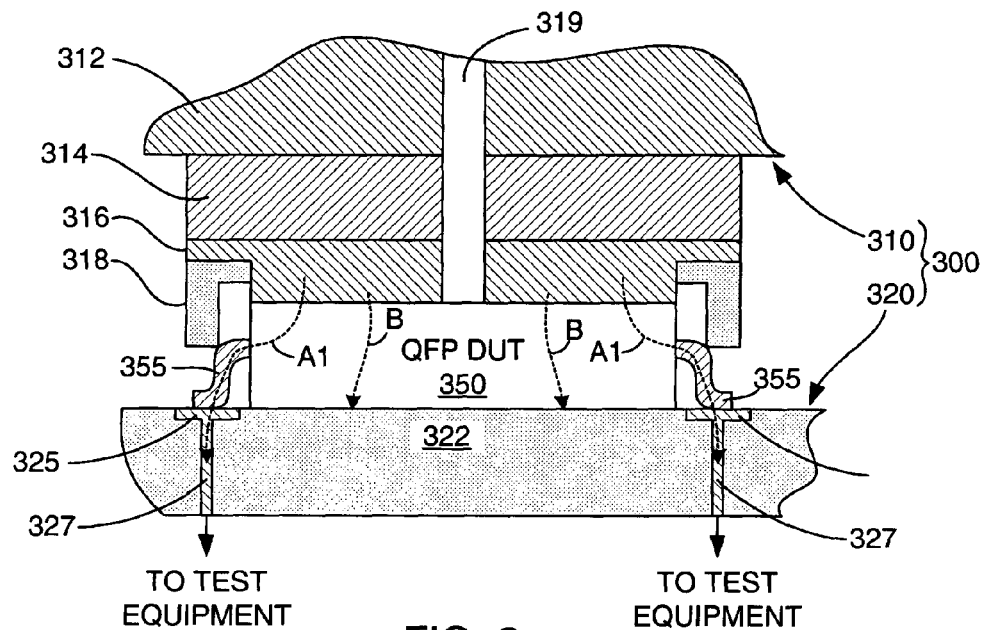
FIG. 3 is a cross-sectional side view showing a Quad Flat Pack (QFP) Device Under Test (DUT) mounted between a test head and a test socket in an automated test equipment (ATE) system.

FIG. 3 is a cross-sectional side view showing a conventional QFP-DUT 350 mounted between a test head 310 and a test socket 320 of an Automatic Test Equipment (ATE) system 300. Test head 310 includes a heater block 312, a custom base piece 314, a transfer plate 316, and a castellation piece 318. A vacuum passage 319 is defined between a vacuum source (not shown) and a lower surface of transfer plate 316 for lifting and transferring DUTs in the manner described above with reference to FIG. 1. Custom plate 314 and transfer plate 316 are formed from a highly heat conductive material (e.g., aluminum) to facilitate heat transfer between heater block 312 and QFP DUT 350. Castellation piece 318 is formed from an electrically non-conductive material (e.g., Peak plastic), and serves to press leads 355 extending from QFP DUT 350 toward test socket 320. Test socket 320 includes a substantially non-conductive body 322 (e.g., FR-4) that supports several contact pads 325 that are electrically connected to test equipment (not shown) via conductor 327.

The present inventors have determined that a problem associated with conventional thermal test procedures directed to QFP-type IC devices is that the procedures do not accurately model the heat transfer from test head 310 to test socket 320, thereby providing inaccurate temperature measurement values that can differ by several degrees from the actual temperature of the DUT. In particular, as indicated in FIG. 3, heat generated by heater block 312 is passed through custom plate 314 and transfer plate 316 to QFP DUT 350. Because QFP 350 typically rests on an electrically non-conductive body 322, a relatively small amount of heat transfer (indicated by arrows B) between test head 310 and test socket 320 passes through the body of QFP DUT 350. However, the present inventors have determined that a significant thermal path (indicated by arrows A1) is created from QFP-DUT 350 to contact pads 325 of test socket 320 via leads 355. The present inventors have also determined that test blocks that only model heat transfer path B (i.e., do not model heat transfer path A1) produce temperatures that can differ significantly from actual QFP DUTs 350, thereby resulting in erroneous temperature verification.

Referring back to FIGS. 2(A), 2(B), and 2(C), the embodiment of the present invention addresses the above deficiency of body-only test blocks by providing angled rails 220 along the sides of test block 200 that emulate the thermal path of the leads extending from QFP IC devices. In one embodiment, each rail 220 includes a first flange 222 extending perpendicular to its corresponding side wall 215, and a second flange 225 extending downward at a right angle from first flange 222. A free end (lower edge) 227 is located at a lower end of second flange 225, and a groove 229 is defined between second flange 225 and body 210.

Figure 4:
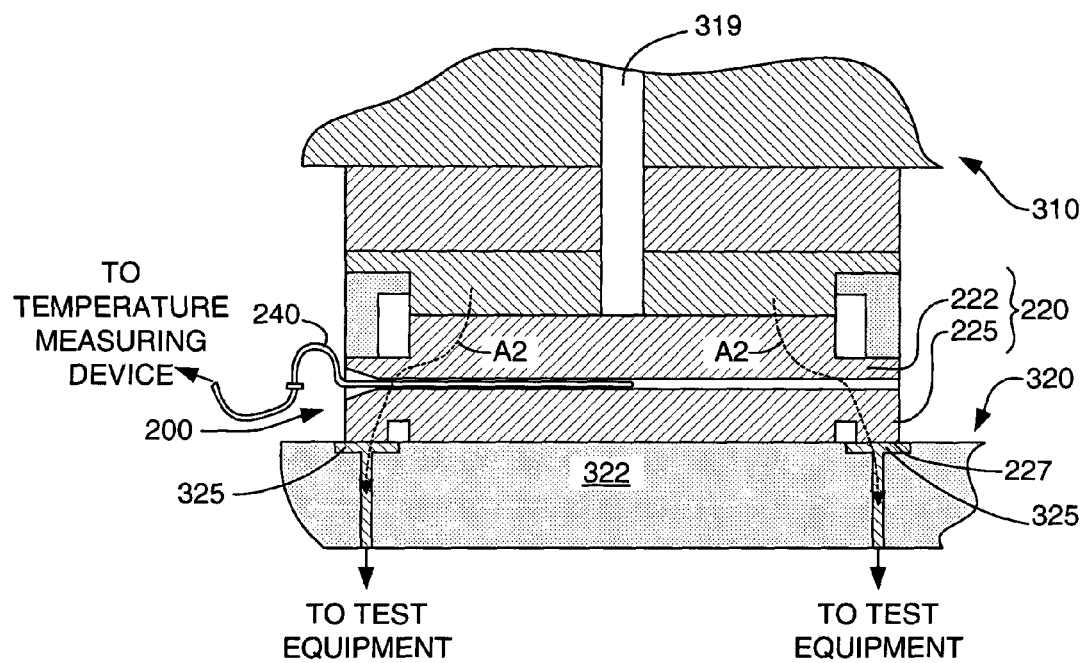
FIG. 4 is a cross-sectional side view showing the test block of FIG. 2 mounted between the test head and test socket of the ATE system shown in FIG. 3.

FIG. 4 is a cross sectional side view showing test block 200 mounted between test head 310 and test socket 320 of the ATE system introduced above. As indicated, test block 200 is mounted such that body 210 rests on substantially non-conductive body 322 of test socket 320, and free ends 227 of each rail 220 abut contact pads 325 of test socket 320. Accordingly, rails 220 provide a thermal path A2 between test head 310 and test socket 320 that accurately emulates the heat transfer path A1 associated with actual QFP DUTs (see FIG. 3), thereby providing a more accurate estimation of the actual test temperature encountered by subsequently (or previously) tested QFP-type IC devices.

Referring again to FIGS. 2(B) and 2(C), according to another aspect of the present invention, a tapered hole 230 is formed in first flange 222 of angled rail 220(1) that extends into body 210 in a direction parallel to upper surface 212 and lower surface 217, and a thermocouple 240 is mounted in hole 230 such that a tip 245 of thermocouple 240 is positioned at a central location 219 of body 210. According to a preferred embodiment, hole 230 passes entirely through body 210 and cooperates with a second opening 235 formed in a second angled rail 220(2), thereby facilitating easy removal of thermocouple 240 (e.g., by drilling through opening 235). As indicated in FIG. 4, by forming hole 230 in first flange 222 of angled rail 220(1), a protruding end of thermocouple 240 is located in a clearance formed between test head 310 and test socket 320 when test block 200 is pressed between these structures. As discussed below, thermocouple 240 is utilized to measure the temperature of test block 200 during the temperature verification process associated with the embodiment of the present invention.

Figure 5:
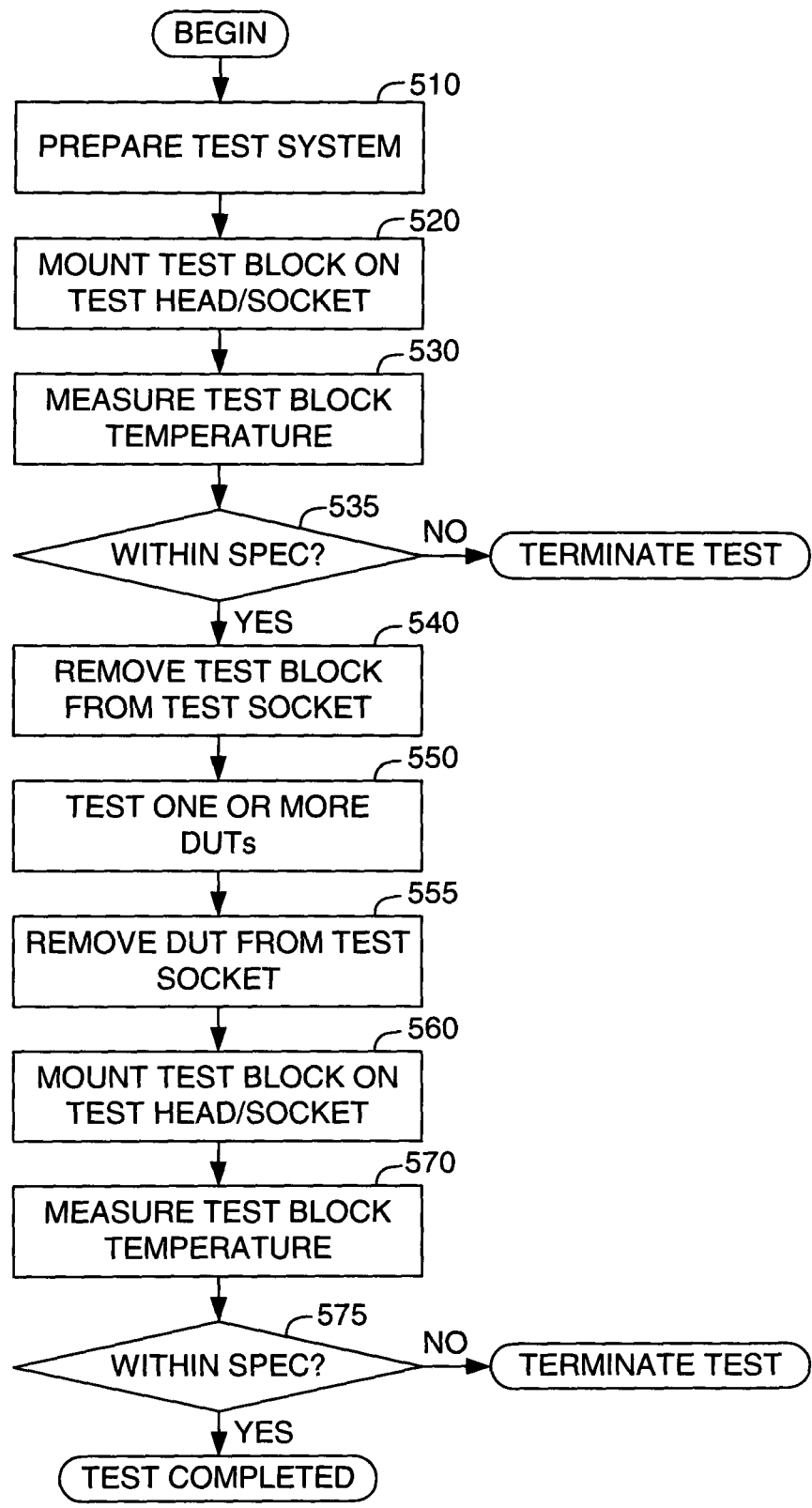
FIG. 5 is a flow diagram depicting a test method according to another embodiment of the present invention.

FIG. 5 is a flow diagram showing a method for verifying a temperature of a QFP-type IC device during a thermal testing process according to another embodiment of the present invention. The thermal testing process begins by initializing the ATE system (step 510), including heating/cooling a soaking plate to the specified test temperature, and placing DUTs onto the soaking plate for a suitable period. In addition, initializing the ATE system involves heating/cooling test head 310 and/or test socket 320 (see FIGS. 3 and 4) to the specified test temperature.

After the ATE system is initialized, test block 200 is mounted between test head 310 and test socket 320 at a step 520 in the manner shown in FIG. 4 (i.e., such that thermal path A2 is established from test head 310 into test block 200, and from test block 200 into contact pads 325 formed on test socket 320). As described above, in one embodiment this thermal path is facilitated by angled rails 220.

After a suitable period to allow test block 200 to reach a stable temperature, a first verification process is performed to verify that the test system is at the specified test temperature. This first verification process involves measuring (reading) a first temperature of test block 200 using thermocouple 240 (e.g., measuring a resistance of thermocouple 240; step 530), and then comparing the measured temperature with a stored temperature range (i.e., the specified test temperature plus/minus an acceptable variance; step 535). If the measured temperature is outside of the specified temperature range (NO in step 535), then the test is terminated and corrective action is performed (i.e., the temperature of the ATE system is adjusted). Conversely, if the measured temperature is within the specified temperature range (YES in step 535), then control passes to step 540.

Upon completing the first verification test, one or more DUTs are systematically moved from the ATE system soaking plate to a located between test head 310 and test socket 320 (shown in FIG. 3) in a manner similar to that described above with reference to FIG. 1 (step 550). In particular, this testing process involves causing test head 310 to move the DUT onto test socket 320 such that leads 355 are pressed against corresponding contact pads 325, and test signals are driven from associated test equipment onto leads 355 via contact pads 325.

After testing a predetermined number of DUTs, the final DUT is removed (step 555), and a second verification process is performed to verify that the test system has remained within the specified test temperature range throughout the DUT testing process. Similar to the first verification process, the second verification process involves measuring (reading) a second temperature of test block 200 using thermocouple 240 (steps 560 and 570), and then comparing the measured temperature with a stored temperature range (step 575). As with the first verification process, if the measured temperature is outside of the specified temperature range (NO in step 575), then the test is terminated and corrective action is performed. Note that, in this instance, successful testing of the previously-tested DUTs is not verified, and these DUTs must be re-tested after the corrective action is performed. Conversely, if the measured temperature is within the specified temperature range (YES in step 575), then successful testing of the previously-tested DUTs is verified. That is, the process applies the reasonable assumption that if the first temperature of test block 200 is within specification before testing the DUTs, and the second temperature of test block 200 is within specification after testing the DUTs, then the temperature of the DUTs was within the specified range throughout the actual testing process.

As suggested above, in addition to the specific embodiments disclosed herein, other modifications to the test methods of the present invention are also possible that fall within the spirit and scope of the present invention. Therefore, the invention is limited only by the following claims.

We claim:

1. A test block for an automatic test equipment (ATE) system, the test block comprising:
   a body having an upper surface shaped such that it is received by a test head, a lower surface shaped to be received by a corresponding portion of a test socket, and a side wall extending between the upper surface and the lower surface; and
   an angled rail extending from the side wall of the body and having a free end positioned to engage contact pads of the test socket when the test block is mounted between the test head and test socket, wherein the body and the angled rail emulate a thermal characteristic of a device to be tested between the test head and contact pads of test socket;
   a hole formed in a first flange of the angled rail and extending into the body in a direction parallel to the upper surface; and
   a thermocouple mounted in the hole such that a tip of the thermocouple is positioned at a central location within the body.

2. The test block according to claim 1, wherein the first flange extends perpendicular to the side wall, and further comprising a second flange extending downward at a right angle from the first flange.

3. The test block according to claim 1, wherein the hole passes through the body and cooperates with a second opening formed in a second angled rail.

4. The test block according to claim 1, wherein a first end of the hole is tapered.

5. The test block according to claim 1, wherein the test block comprises one or more metals.

6. The test block according to claim 5, wherein the test block comprises Aluminum.

7. The test block according to claim 1, wherein the body includes four side walls and four angled rails, each angled rail extending from an associated side wall.

8. A method for verifying a temperature of an IC device during a thermal testing process, wherein the IC device includes a body and a plurality of leads extending from the body, and wherein the thermal testing process is performed using an automatic test equipment system including a test head and a test socket, the method comprising:
   mounting a test block between the test head and the test socket such that a thermal path is established from the test head into the test block, and from the test block into a plurality of contact pads formed on the test socket;
   verifying that a first temperature of the test block is within a specified temperature range;
   removing the test block from the test socket;
   testing the IC device by causing the test head to move the IC device onto the test socket such that the plurality of leads are pressed against the plurality of contact pads, and by subsequently driving test signals onto the plurality of leads via the plurality of contact pads;
   removing the IC device from the test socket;
   re-mounting the test block between the test head and the test socket such that the thermal path is re-established; and
   verifying that a second temperature of the test block is within the specified temperature range.

9. The method according to claim 8, wherein the test block includes a body and a rail extending from the body, and wherein establishing the thermal path includes mounting the test block such that a free end of the rail contacts the plurality of contact pads.

10. The method according to claim 8, further comprising initializing the automatic test equipment system to a specified temperature before mounting the test block and verifying the first temperature.

11. The method according to claim 8, wherein the test block includes a thermocouple, and wherein verifying the first temperature comprises measuring a resistance of the thermocouple.

12. A test block for an automatic test equipment (ATE) system, the test block comprising:
   a body having an upper surface shaped such that it is received by a test head, a lower surface shaped to be received by a corresponding portion of a test socket, and a side wall extending between the upper surface and the lower surface;
   an angled rail extending from the side wall of the body and having a free end positioned to engage contact pads of the test socket when the test block is mounted between the test head and test socket, wherein the body and the angled rail emulate a thermal characteristic of a device to be tested between the test head and contact pads of test socket;

a hole defined from a first angled rail to a second angled rail and extending through the body in a direction parallel to the upper surface; and a thermocouple mounted in the hole such that a tip of the thermocouple is positioned at a central location within the body.

* * * * *